(12) United States Patent
Sato

(10) Patent No.: US 7,615,452 B2
(45) Date of Patent: Nov. 10, 2009

(54) METHOD OF FABRICATION OF NORMALLY-OFF FIELD-EFFECT SEMICONDUCTOR DEVICE

(75) Inventor: Ken Sato, Saitama (JP)

(73) Assignee: Sanken Electric Co., Ltd. (JP)

( * ) Notice: Subject to any disclaimer, the term of this patent is extended or adjusted under 35 U.S.C. 154(b) by 0 days.

(21) Appl. No.: 12/165,913

(22) Filed: Jul. 1, 2008

(65) Prior Publication Data

US 2009/0008676 A1 Jan. 8, 2009

(30) Foreign Application Priority Data

Jul. 6, 2007 (JP) .............................. 2007-178390

(51) Int. Cl.
*H01L 21/336* (2006.01)
(52) U.S. Cl. .................... 438/270; 438/259; 438/271; 438/272; 438/481; 257/E21.566
(58) Field of Classification Search ................ 438/259, 438/270, 271, 272, 481; 257/E21.566
See application file for complete search history.

(56) References Cited

U.S. PATENT DOCUMENTS

| | | | | |
|---|---|---|---|---|
| 6,008,126 | A * | 12/1999 | Leedy | 438/667 |
| 6,927,155 | B2 * | 8/2005 | Lugauer et al. | 438/604 |
| 7,399,687 | B2 * | 7/2008 | Hiramatsu et al. | 438/483 |
| 2004/0266157 | A1 * | 12/2004 | Lugauer et al. | 438/602 |
| 2005/0093099 | A1 * | 5/2005 | Koike et al. | 257/615 |
| 2005/0161702 | A1 * | 7/2005 | Linthicum et al. | 257/183 |
| 2006/0213429 | A1 * | 9/2006 | Motoki et al. | 117/86 |
| 2006/0273343 | A1 * | 12/2006 | Nakahata et al. | 257/103 |
| 2008/0006201 | A1 * | 1/2008 | Hirota et al. | 117/90 |
| 2008/0202409 | A1 * | 8/2008 | Motoki et al. | 117/84 |
| 2009/0071394 | A1 * | 3/2009 | Nakahata et al. | 117/2 |
| 2009/0085055 | A1 * | 4/2009 | Peng et al. | 257/103 |

FOREIGN PATENT DOCUMENTS

| | | |
|---|---|---|
| JP | 2005158889 | 6/2005 |
| JP | 2005183733 | 7/2005 |
| JP | 2006100820 | 4/2006 |

\* cited by examiner

*Primary Examiner*—Matthew Smith
*Assistant Examiner*—John M Parker
(74) *Attorney, Agent, or Firm*—Woodcock Washburn LLP

(57) ABSTRACT

A normally-off HEMT is made by first providing a substrate having its surface partly covered with an antigrowth mask. Gallium nitride is grown by epitaxy on the masked surface of the substrate to provide an electron transit layer comprised of two flat-surfaced sections and a V-notch-surfaced section therebetween. The flat-surfaced sections are formed on unmasked parts of the substrate surface whereas the V-notch-surfaced section, defining a V-sectioned notch, is created by lateral overgrowth onto the antigrowth mask. Aluminum gallium nitride is then deposited on the electron transit layer to provide an electron supply layer which is likewise comprised of two flat-surfaced sections and a V-notch-surfaced section therebetween. The flat-surfaced sections of the electron supply layer are sufficiently thick to normally generate two-dimensional electron gas layers due to heterojunctions thereof with the first and the second flat-surfaced section of the electron transit layer. The V-notch-surfaced section of the electron supply layer is not so thick, normally creating an interruption in the two-dimensional electron gas layer.

13 Claims, 6 Drawing Sheets

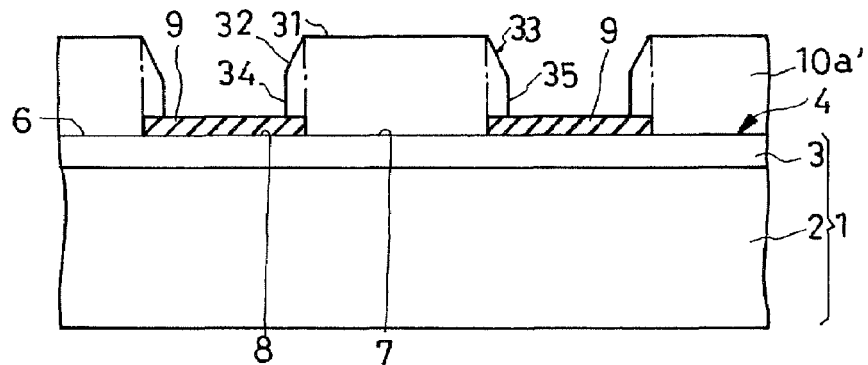
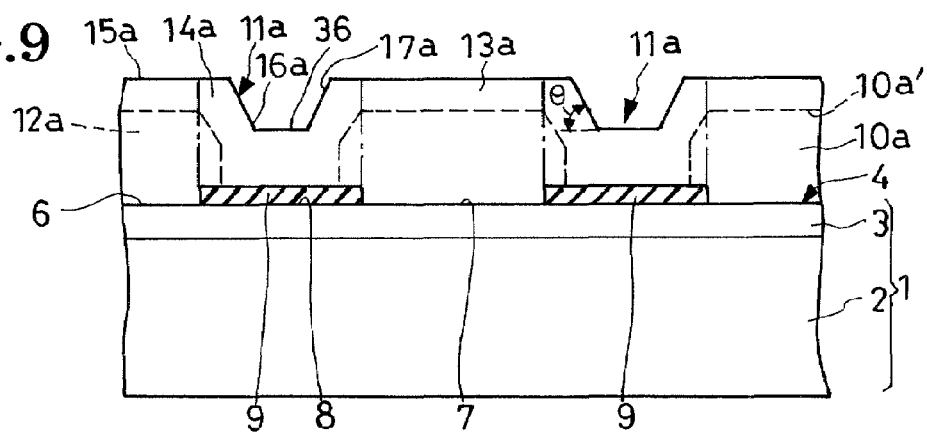
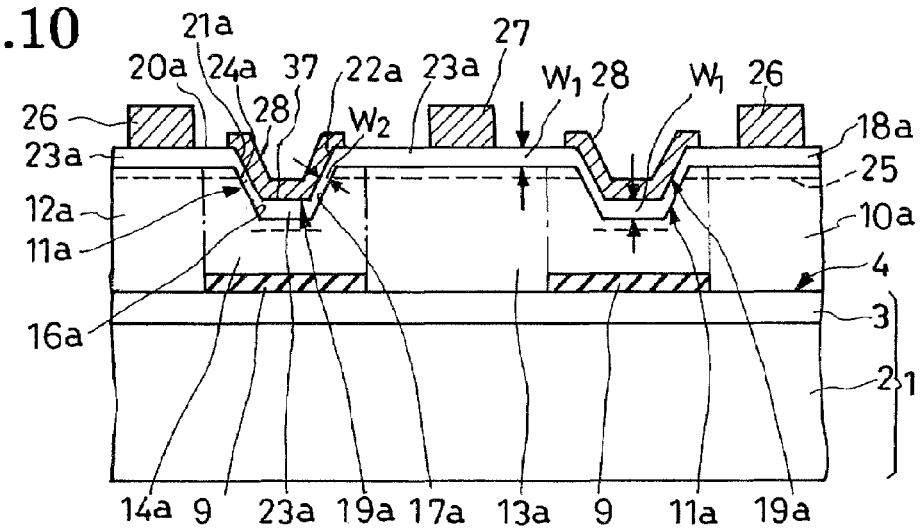

METHOD OF FABRICATION OF NORMALLY-OFF FIELD-EFFECT SEMICONDUCTOR DEVICE

CROSS REFERENCE TO RELATED APPLICATIONS

This application claims priority to Japanese Patent Application No. 2007-178390, filed Jul. 6, 2007.

BACKGROUND OF THE INVENTION

This invention relates to semiconductor devices, particularly to field-effect semiconductor devices as typified by the high electron mobility transistor (HEMT), and more particularly to such field-effect semiconductor devices that operate normally off. The invention also pertains to a method of fabricating such normally-off field-effect semiconductor devices.

HEMTs have been known which are made from semiconducting nitrides belonging to Groups III-V compounds. Japanese Unexamined Patent Publication No. 2005-158889 is hereby cited as dealing with this type of semiconductor devices which are pertinent to this invention. The prior art HEMT comprises an electron transit layer of undoped gallium nitride (GaN) grown on a silicon substrate via a buffer layer, and an electron supply layer of n-type aluminum gallium nitride (AlGaN) deposited on the electron transit layer. A source, a drain and a gate electrode are disposed in prescribed positions on the electron supply layer.

Made from the dissimilar semiconducting materials with unequal band gaps, the electron transit layer and electron supply layer provide a heterojunction therebetween. Spontaneous depolarization and piezoelectric depolarizations of this heterojunction provide in combination a channel of very low resistance, or of high electron mobility, for source-drain current flow under the control of a voltage applied to the gate. This channel is known to the specialists as a two-dimensional electron gas layer.

The HEMT of the general construction above was normally on; that is, there was a source-drain flow of electrons while no voltage was applied to the gate. The normally-on HEMT had to be turned off using a negative power supply for causing the gate to gain a negative potential. Use of such a negative power supply made the associated circuitry unnecessary complex and expensive. The conventional normally-on HEMT was rather inconvenient of use.

Attempts have been made to render the HEMT normally off by making the AlGaN electron supply layer thinner. A thinner electron supply layer weakens the electric field due to piezoelectric depolarization caused by the heterojunction between electron supply layer and electron transit layer, resulting in the diminution of electron concentration in the two-dimensional electron gas layer. The two-dimensional electron gas layer disappears just under the gate when a field due to the built-in potential between the electron supply layer and the Schottky gate acts upon the two-dimensional electron gas layer of reduced electron concentration. The HEMT can thus be held off between drain and source without application of a bias voltage to the gate.

The normally-off HEMT based upon this conventional scheme proved to possess its own drawback, however. As a result of the thin electron supply layer, the two-dimensional electron gas layer suffered an unnecessary drop in electron concentration at other than right below the gate, too. The result was an inconveniently high drain-source turn-on resistance.

A remedy to this inconvenience is found in Japanese Unexamined Patent Publication No. 2005-183733, which suggests to make the electron supply layer thinner only under the gate as by dry etching. The selective etching of the electron supply layer is objectionable because it is likely to lead to the impairment of the semiconductor crystal structures of both electron supply layer and electron transit layer. Selectively etching the electron supply layer without causing these inconveniences was indeed highly difficult, and the resulting HEMTs were not necessarily satisfactory in performance. For all these reasons, as far as the present applicant is aware, there seem to be no normally-off HEMTs that are available on the market today.

Japanese Unexamined Patent Publication No. 2006-100820 represents a different approach to the normally-off HEMT. It proposes to introduce a slant into part of the electron transit layer and electron supply layer. The source and drain electrodes are placed on the electron supply layer on a level with the top and bottom, respectively, of slant, and the gate electrode is positioned on the slant itself via an insulating seat. This proposed construction is not necessarily reliable for stable HEMT operation in normally-off mode.

There have been consistent demands from electronics and allied industries for not only normally-off two-dimensional-electron-gas HEMTs but normally-off two-dimensional-hole-gas HEMTs and other such field-effect transistor devices too.

SUMMARY OF THE INVENTION

It is among the objects of this invention to render field-effect semiconductor devices of the kind defined, capable of operation in normally-off mode without sacrificing their electrical and physical characteristics.

Another object of the invention is to provide a method of fabricating normally-off field-effect semiconductor devices that meet the first recited object.

Briefly, the invention may be summarized in one aspect thereof as a method of fabricating a normally-off field-effect semiconductor device utilizing a two-dimensional carrier (i.e., electron or hole) gas layer created by a heterojunction between layers of dissimilar semiconducting materials as a channel. The method dictates, first of all, covering part of a major surface of a substrate with an antigrowth mask. Then a first semiconducting material is epitaxially grown on the masked major surface of the substrate until there is created a first semiconductor layer (e.g., electron transit layer). Being grown on the partly masked substrate surface, this first semiconductor layer is formed to include a first and a second flat-surfaced section and a slant-surfaced section therebetween, at least the slant-surfaced section of the first semiconductor layer overlying the antigrowth mask on the substrate surface as a result of lateral overgrowth of the first semiconducting material. Then a second semiconducting material is epitaxially grown on the first semiconductor layer thereby creating a second semiconductor layer (e.g., electron supply layer) thereon. The second semiconductor layer has a first and a second flat-surfaced section and a slant-surfaced section, which are formed respectively on the first and the second flat-surfaced section and slant-surfaced section of the first semiconductor layer. Then there are formed a first major electrode which is electrically coupled to a two-dimensional carrier gas layer due to a heterojunction between the first flat-surfaced sections of the first and the second semiconductor layer, a second major electrode which is electrically coupled to the two-dimensional carrier gas layer due to a heterojunction between the second flat-surfaced sections of the first and the second semiconductor layer, and gating means on the slant-surfaced section of the second semiconductor layer for control of conduction between the first and the second major electrode.

Another aspect of the invention concerns a normally-off field-effect semiconductor device that is capable of fabrication by the above summarized method. Included is a substrate having a surface partly covered with an antigrowth mask. Formed by epitaxially growing a first semiconducting material on the masked substrate surface, a first semiconductor layer comprises a first and a second flat-surfaced section and, therebetween, a slant-surfaced section, at least the slant-surfaced section of the first semiconductor layer being created by lateral overgrowth of the first semiconducting material onto the antigrowth mask on the substrate surface. A second semiconductor layer, formed on the first semiconductor layer, likewise comprises a first and a second flat-surfaced section and a slant-surfaced section therebetween, which are disposed respectively on the first and the second flat-surfaced section and slant-surfaced section of the first semiconductor layer. The first and the second flat-surfaced section of the second semiconductor layer are sufficiently thick to normally generate two-dimensional carrier gas layers due to heterojunctions thereof with the first and the second flat-surfaced section of the first semiconductor layer. At least part of the slant-surfaced section of the second semiconductor layer is too thin to normally generate a two-dimensional carrier gas layer due to a heterojunction thereof with the slant-surfaced section of the first semiconductor layer. A break is thus normally created in a two-dimensional carrier gas layer between two major electrodes of the device, making this device normally off. The two-dimensional carrier gas layer is completed upon voltage application to gating means on the slant-surfaced section of the second semiconductor layer.

The slant-surfaced sections of the two semiconductor layers may take various forms in practice. In one embodiment of the invention, for example, the slant-surfaced section of the first semiconductor layer has a notch of V-shaped cross section formed therein. The slant-surfaced section of the second semiconductor layer is formed in that notch and itself defines a notch of V-shaped cross section. The slant-surfaced section of the second semiconductor layer, defining the pair of oppositely sloping surfaces of the V-sectioned notch is wholly too thin to normally generate a two-dimensional carrier gas layer.

In another embodiment the slant-surfaced section of the first semiconductor layer has a notch of quasi-V-shaped cross section formed therein. Grown in this quasi-V-sectioned notch, the slant-surfaced section of the second semiconductor layer itself defines a notch of similar cross-sectional shape having a pair of slanting side surfaces and a flat bottom therebetween. The second semiconductor layer is too thin at its parts defining the pair of slanting side surfaces of the quasi-V-sectioned notch to normally generate a two-dimensional carrier gas layer.

It will be appreciated that the V- or quasi-V-sectioned notch, or any such depression or indentation, in the slant-surfaced section of the first semiconductor layer is created by lateral overgrowth of the first semiconducting material onto the antigrowth mask on the substrate surface. The second semiconductor layer with its flat-surfaced and slant-surfaced sections may be deposited on the first semiconductor layer only to such depths as to possess a surface configuration akin to that of the first semiconductor layer.

The notched or otherwise indented surfaces of the two semiconductor layers are created purely epitaxially, rather than by etching, a possible alternative, which unavoidably involves degradation of crystallinity. Grown epitaxially, with lateral overgrowth utilized for creation of slant-surfaced sections, the semiconductor layers are notable for fewer dislocations and excellent crystallinity. Thus the present invention succeeds in making the field-effect semiconductor device normally off without in any way sacrificing its performance.

Moreover, merely by being deposited on the preformed first semiconductor layer, the second semiconductor layer is formed to include the slant-surfaced section which is essential for provision of a normally-off field-effect semiconductor device. The field due to the depolarization of the slant-surfaced section of the second semiconductor layer is so weak that it normally generates no two-dimensional carrier gas layer, or at most not to such an extent as to provide a current path, in the first semiconductor layer. The device is therefore normally off.

The threshold of the device varies with the angle of a slanting surface or surfaces of the slant-surfaced sections of the semiconductor layers. That angle, then, is controllable in terms of the growth rates of the semiconductor layers. The threshold of the device is capable of easy, fine adjustment.

Either part or all of the slant-surfaced section of the second semiconductor layer may be made thinner than the rest of that layer, so much so that the device is infallibly made normally off. The other, thicker parts of the second semiconductor layer serve to make the associated two-dimensional carrier gas layer higher in carrier concentration and so to lower the turn-on resistance of the normally-off device.

The above and other objects, features and advantages of this invention will become more apparent, and the invention itself will best be understood, from a study of the following description and appended claims, with reference had to the attached drawings showing some preferable embodiments of the invention.

BRIEF DESCRIPTION OF THE DRAWINGS

FIG. 8 is a fragmentary, diagrammatic sectional view showing the first semiconductor layer of still another preferred form of normally-off HEMTs according to the invention in its intermediary state during the progress of epitaxial growth on the masked surface of the substrate.

FIG. 9 is a view similar to FIG. 8 but showing the first semiconductor layer subsequently completed.

FIG. 10 is a view similar to FIG. 9 but showing the second semiconductor layer subsequently grown on the first semiconductor layer, and the electrodes further subsequently formed on the second semiconductor layer, to complete the third preferred form of normally-off HEMTs according to the invention.

DESCRIPTION OF THE PREFERRED EMBODIMENTS

The present invention will now be described more specifically, first in terms of a preferred method of manufacturing a first preferred form of normally-off HEMTs according to the invention. FIGS. 1-6 of the above drawings illustrate the sequential steps of manufacturing the first preferred form of normally-off HEMTs. FIG. 6 shows the normally-off HEMTs completed.

Figure 1:
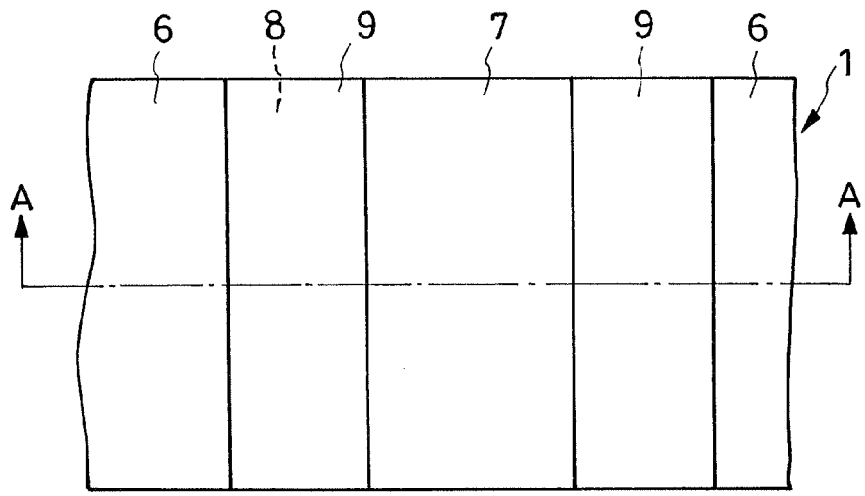
FIG. 1 is a fragmentary, diagrammatic plan view of a substrate shown together with antigrowth masks on its surface, the view being explanatory of a first step in the fabrication of a first preferred form of normally-off HEMTs according to the invention.
Figure 2:
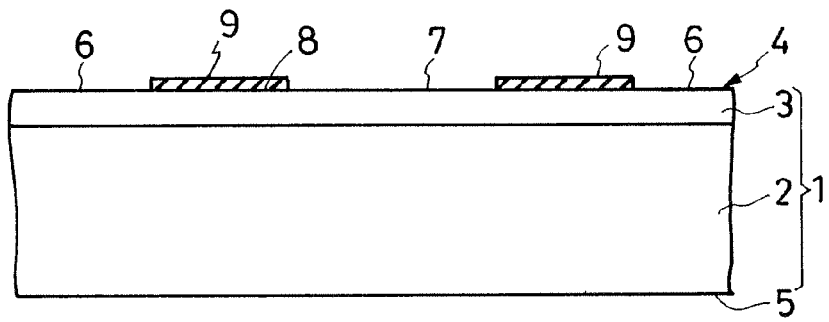
FIG. 2 is a fragmentary, diagrammatic sectional view of the substrate taken along the line A-A in FIG. 1.

With reference first to FIGS. 1 and 2 the fabrication of the representative normally-off HEMTs starts with the preparation of a substrate 1 on which the constituent layers of the HEMTs are to be grown by epitaxy. The substrate 1 comprises a first layer 2 of monocrystalline silicon semiconductor and, formed thereon, a second layer 3, known as a buffer, of a semiconducting nitride. The substrate 1 has a first major surface or top 4 and a second major surface or bottom 5. The first layer 2 is exposed at the bottom 5, and the second layer 3 at the top 4.

The first layer 2 of the substrate 1 must be fit for epitaxial growth of the second layer 3 thereon and sufficiently thick (e.g. 300-1000 micrometers) to provide a mechanical support for the main semiconductor region, yet to be described, of the HEMTs grown subsequently thereon as well as the electrodes on the main semiconductor region. It is understood that the major surface of the first layer 2 of monocrystalline silicon semiconductor is exactly (111) in terms of Miller indices. Materials other than silicon are adoptable for the first substrate layer 2, examples being semiconductors such as silicon carbide, gallium nitride, and aluminum nitride, or insulators such as sapphire and various ceramics.

The second layer 3 of the substrate 1 overlies the first layer 2 for buffering the main semiconductor region of the HEMTs to be grown epitaxially thereon. In practice the second layer 3 may be a lamination of sublayers of aluminum nitride (AlN) and gallium nitride (GaN) formed by any such epitaxial growth methods as metalorganic chemical vapor deposition (MOCVD). As required or desired, the second layer 3 may take the form of a desired number of alternations of AlN and GaN sublayers. Groups III-V compound semiconductors other than AlN and GaN are adoptable for the second layer 3. Monolayer construction is also possible. Being not directly associated with HEMT operation, the second layer 3 is omissible altogether.

The next step is the antigrowth masking of the top 4 of the substrate 1. FIGS. 1-6 are drawn on the assumption that a plurality of HEMTs are being jointly fabricated on a single substrate. So a plurality of antigrowth masks 9 extend across the substrate top 4 with spacings 6 and 7 on both sides of each such mask. (The reference numeral 8 in FIGS. 1 and 2 indicates those parts of the substrate surface 4 which are covered with the antigrowth masks 9).

As the name implies, the antigrowth masks 9 are intended to inhibit the epitaxial growth of a nitride semiconductor on the substrate 1. The masks 9 must therefore be made from an insulating material that can perform this function, besides being stable both chemically and thermally and permitting itself to be processed exactly into prescribed patterns by any known or suitable methods. Silica ($SiO_2$) meets all these requirements. Other employable materials include $SiO_x$, where $0<x<2$, silicon nitrides such as SiON, $SiN_x$, where x is an arbitrary number, $Si_3N_4$ and $Si_2N_3$, aluminum oxide ($Al_2O_3$), and aluminum nitride (AlN) grown epitaxially at low temperatures.

Any of these materials may first be filmed on the entire substrate surface as by chemical vapor deposition. Then the deposit may be selectively etched away, leaving the antigrowth masks 9 on the substrate surface 4.

As will become apparent as the description proceeds, the antigrowth masks 9 on the substrate surface 4 predetermine the positions of trenches or notches 11, FIG. 4, of V-shaped cross section (hereinafter referred to as "V-notches") to be formed subsequently in an electron transit layer 10, as well as of V-notches 19, FIG. 5, in an electron supply layer 18. As the antigrowth masks 9 extend transversely of the substrate 1 at prescribed spacings, so do the V-notches 11 and 19. In order to obtain the V-notches 11 in the electron transit layer 10, the antigrowth masks 9 should each extend parallel to the orientation <1100> of the GaN crystal of the second substrate layer 3 or along the orientation <1120>. The width of the antigrowth masks 9 depends upon that of gate electrodes 28, FIG. 6, to be formed subsequently in the V-notches 19 in the electron supply layer 18. Despite the showing of FIG. 2, the substrate surface 4 need not be flat all over; instead, the masked parts 8 may be raised higher than the unmasked parts 6 and 7.

Figure 3:
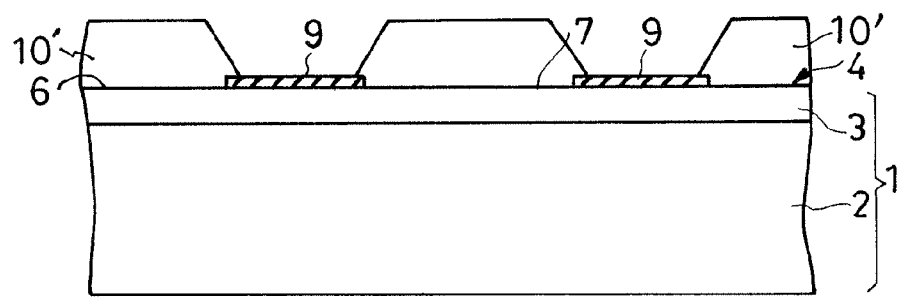
FIG. 3 is a view similar to FIG. 2 but showing the first semiconductor layer of the normally-off HEMTs in its intermediary state during the progress of its epitaxial growth on the masked surface of the substrate.

The next step is the creation by MOCVD of the electron transit layer as the first semiconductor layer on the partially masked substrate surface 4. FIG. 3 depicts the electron transit layer 10' in a transitional, intermediary state during its growth, and FIG. 4 indicates the electron transit layer 10 fully grown. A first semiconducting material for the electron transit layer 10 is a first nitride semiconductor. Preferred materials for the electron transit layer 10 are generally definable as $Al_xIn_yGa_{1-x-y}N$, where $0 \leq x<1$, $0 \leq y<1$, and $0 \leq x+y<1$. The particular material employed in this embodiment is undoped GaN (subscripts x and y are both zero in the formula above).

As will be understood from a consideration of FIG. 3, GaN will first deposit only upon the parts 6 and 7 of the substrate surface 4 which are left uncovered by the antigrowth masks 9 formed along the crystal orientation <1100> of the substrate surface. However, as the deposition progresses, GaN will grow not only perpendicular to the substrate surface 4 but also laterally or parallel to that surface or in the direction of <112

0>, thereby gradually filling the spaces over the antigrowth masks 9. Finally, as pictured in FIG. 4, there will be obtained the electron transit layer 10 complete with the V-notches 11 above the antigrowth masks 9.

Semiconductor specialists are familiar with the epitaxial lateral overgrowth (ELO) technology whereby a flat film is epitaxially created by utilizing lateral overgrowth of GaN or other semiconducting materials. The method of the instant invention is comparable to ELO but is clearly distinguished therefrom in that the V-notches 11 are intentionally created by terminating the GaN growth long before a flat layer is obtained.

The parameters of GaN growth are assumed to be unchanged throughout the fabrication of the electron transit layer 10 complete with the V-notches 11. Optionally, however, the growth parameters for the incomplete electron transit layer 10' may differ from those for the finished electron transit layer 10.

Figure 4:
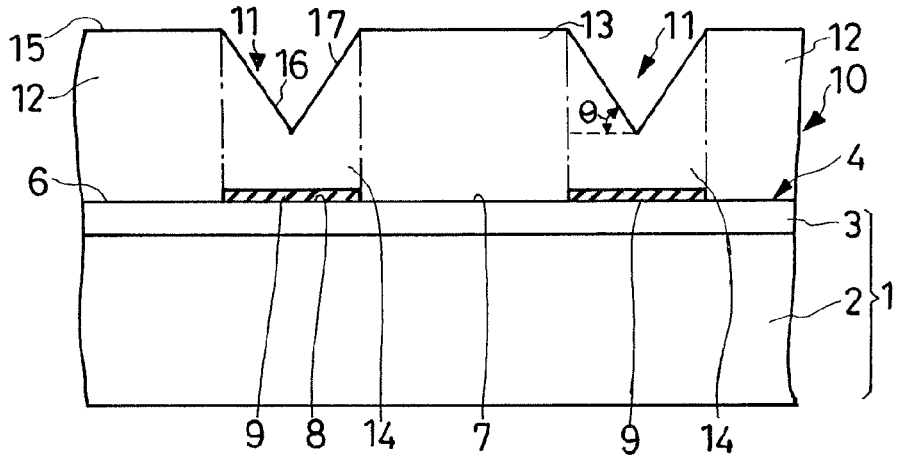
FIG. 4 is a view similar to FIG. 3 but showing the first semiconductor layer of the normally-off HEMTs subsequently completed on the masked surface of the substrate.

A closer study of FIG. 4 will reveal that the finished electron transit layer 10 is, for each HEMT to be made, an integral combination of two flat-surfaced sections 12 and 13 and a V-notch-surfaced section 14 therebetween. (The V-notch-surfaced section represents an example of various slant-surfaced sections within the scope of this invention, additional examples being given in the other embodiments of the invention to be disclosed later.) The flat-surfaced sections 12 and 13 overlie the spacings 6 and 7 between the antigrowth masks 9 whereas the V-notch-surfaced section 14 overlies one of these masks. The flat-surfaced sections 12 and 13 should be sufficiently thick (e.g., 1-3 micrometers) to provide the two-dimensional electron gas layer 25, FIGS. 5 and 6.

The maximal width of each V-notch 11 is arbitrarily variable and may be made either wider or narrower than each antigrowth mask 9. FIG. 4 shows the V-notches 11 to be of the same width as the antigrowth masks 9 by way of example only. The V-notches 11 will be narrower and shallower than the showing of FIG. 4 if the electron transit layer 10 is allowed to grow longer than in this figure. Conversely, should the electron transit layer 10 be grown shorter, then the V-notches 11 will be wider than the antigrowth masks 9, possibly encroaching upon the flat-surfaced sections 12 and 13. In any event, however, the V-notches 11 should not be so deep as to reach the antigrowth masks 9 but should be so shallow as to leave a current path between themselves and the antigrowth masks.

FIG. 4 also indicates that each V-notch 11 in the electron transit layer 10 is defined by a pair of slanting surfaces 16 and 17 extending along, and in register with, one of the antigrowth masks 9 and oppositely angled θ (e.g., 30-80 degrees) with respect to the substrate surface 4. These slanting surfaces 16 and 17 of the V-notch 11 are utilized for making the HEMT normally off according to the novel concepts of this invention, as will become better understood as the description proceeds. It will be appreciated that since the V-notches 11 are formed by epitaxial lateral overgrowth, not by etching, the electron transit layer 10 has its surfaces free from the harmful effects of etching. Additionally, being formed by lateral overgrowth, the V-notch-surfaced section 14 of the electron transit layer 10 is favorable in crystallinity, relatively free from dislocations.

Figure 5:
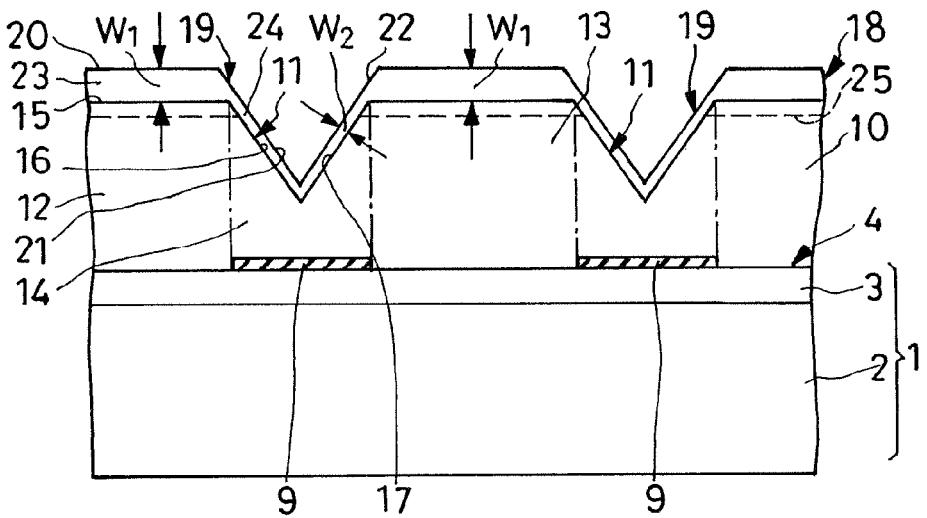
FIG. 5 is a view similar to FIG. 4 but showing the second semiconductor layer of the normally-off HEMTs subsequently grown on the first semiconductor layer.
Figure 6:
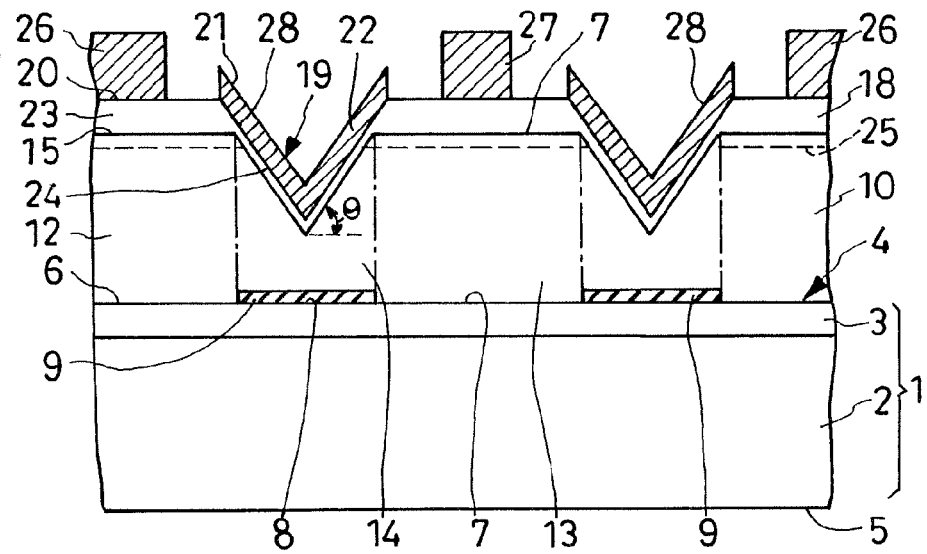
FIG. 6 is a view similar to FIG. 5 but showing the electrodes subsequently formed on the second semiconductor layer to complete the first preferred form of normally-off HEMTs according to the invention.

Then, as illustrated in FIG. 5, the second semiconductor layer 18, known as an electron supply (or barrier) layer, is formed by epitaxy on the electron transit layer 10. The electron supply layer 18 is made from a semiconducting nitride that is greater in bandgap, and less in lattice constant, than the material (e.g., GaN) used for the electron transit layer 10. The semiconducting nitrides adoptable for the electron supply layer 18 are generally expressible by the formula, $Al_a In_b Ga_{1-a-b}N$, where $0 \leq a<1$, $0 \leq b<1$, $0<a+b<1$, and $x<a$. The particular material employed in this embodiment is $Al_a Ga_{1-a}N$ (subscript b is zero in the general formula above) where $0<a<1$ and $x<a$. Preferably, a is in the range of 0.2-0.4, most desirably 0.3, provided that the chosen value is greater than x in the general formula given previously to define the materials for the electron transit layer 10.

Formed by MOCVD, the electron supply layer 18 covers both flat surfaces 15 and V-notch surfaces 16 and 17 of the electron transit layer 10, itself delineating in parts V-notches 19 in conformity with the V-notches 11 in the electron transit layer. Thus the electron supply layer 18 has flat surfaces 20 and V-notch surfaces 21 and 22 corresponding respectively to the flat surfaces 15 and V-notch surfaces 16 and 17 of the electron transit layer 10. The V-notch surfaces 21 and 22 of the electron supply layer 18 are approximately at the same angles as are the V-notch surfaces 16 and 17 of the electron transit layer 10.

FIG. 5 further indicates that the flat-surfaced sections 23 of the electron supply layer 18 have a thickness $W_1$ greater than the thickness $W_2$ of the V-notch-surfaced sections 24 of that layer. The thickness $W_1$ of the flat-surfaced sections 23 is measured normal to its own flat surfaces 20, and the thickness $W_2$ of the V-notch-surfaced sections 24 normal to the V-notch surfaces 21 and 22.

It is to be noted that, even though formed concurrently, the flat-surfaced sections 23 and V-notch-surfaced sections 24 of the electron supply layer 18 have different thicknesses $W_1$ and $W_2$. This difference in thickness results from the fact that the temperature, pressure and like growth parameters of the electron supply layer 18 are so predetermined that the growth rate of the layer is lower in a direction parallel to the flat surfaces 15 of the electron transit layer 10 than in a direction perpendicular thereto.

The thickness $W_1$ of the flat-surfaced sections 23 of the electron supply layer 18 is such that, as indicated by the broken lines in both FIGS. 5 and 6, the well-known two-dimensional electron gas layer 25 is created in the electron transit layer 10 due to at least either of the piezoelectric and spontaneous depolarizations of the electron supply layer 18 in the normal state of the HEMT completed. This thickness $W_1$ may be 5-50 nanometers, preferably 5-30 nanometers, and is significantly less than that of the electron transit layer 10.

On the other hand, the thickness $W_2$ of the V-notch-surfaced sections 24 of the electron supply layer 18 is such that no two-dimensional electron gas layer is normally created in the electron transit layer 10, or no carrier (electron) concentration occurs there to such an extent as to provide a current path, due to either or both the piezoelectric and spontaneous depolarizations of the V-notch-surfaced sections 24. The thickness $W_2$ may be 1-20 nanometers, preferably 1-15 nanometers. Alternatively, the thicknesses $W_1$ and $W_2$ may be made equal to each other, provided that the HEMT is normally off solely under the field-weakening action of the V-notch-surfaced sections 24 of the electron supply layer 18.

Then comes the step of electroding. As illustrated in FIG. 6, each of the HEMTs under joint construction has three electrodes consisting of a source electrode 26 as the first major electrode, a drain electrode 27 as the second major electrode and a gate electrode 28 as the gating means The source electrode 26 is electrically coupled to the two-dimensional electron gas layer 25 generated by the heterojunction between the flat-surfaced section 12 of the electron transit layer 10 and the electron supply layer 18. The drain electrode 27 is electrically coupled to the two-dimensional electron gas layer generated by the heterojunction between the other flat-surfaced section 13 of the electron transit layer 10 and the electron supply layer 18. The gate electrode 28 is received in the V-notch 19, or formed on its slanting surfaces 21 and 22, in the V-notch-surfaced section 24 of the electron supply layer 18.

More specifically, the source electrode 26 is made from metal on the flat surface 20 of the electron supply layer 18 opposite the flat-surfaced section 12 of the electron transit layer 10 via the electron supply layer 18. The drain electrode 27 is made from metal on the flat surface of the electron supply layer 18 opposite the other flat-surfaced section 13 of the electron transit layer 10 via the electron supply layer 18. The gate electrode 28 is also metal made on the V-notch surfaces 21 and 22.

Preferably, the source electrode 26 and drain electrode 27 are both annealed laminations of titanium and aluminum layers. These electrodes are in ohmic (low-resistance) contact with the flat-surfaced sections 12 and 13 of the electron transit layer 10. The gate electrode 28 is a lamination of platinum and gold layers and is in Schottkey contact with the electron transit layer 10.

Operation

Regardless of whether a voltage is being applied to the gate electrode 28, the two-dimensional electron gas layers 25 are generated in the neighborhoods of the heterojunctions between the flat-surfaced sections 12 and 13 of the electron transit layer 10 and the flat-surfaced sections 23 of the electron supply layer 18. Since the flat-surfaced sections 12 and 13 of the electron transit layer 10 are both flat-surfaced and overlain with the relatively thick flat-surfaced sections 23 of the electron supply layer 18, the spontaneous and piezoelectric depolarizations of the electron supply layer 18 provide sufficiently strong electric fields to create the two-dimensional electron gas layers 25 adjacent the heterojunctions between these flat-surfaced parts of the two layers 10 and 18. These two-dimensional electron gas layers 25 provide channels which, however, are normally not electrically interconnected.

That is because no two-dimensional electron gas layer is normally present adjacent the heterojunction between the V-notch-surfaced section 14 of the electron transit layer 10 and the V-notch-surfaced section 24 of the electron supply layer 18. No two-dimensional electron gas layer, and therefore no channel, are normally created there first because the V-notches 11 and 19 exist respectively in the section 14 of the electron transit layer 10 and the section 24 of the electron supply layer 18 and secondly because the section 24 is so thin.

Let it be assumed that the flat-surfaced section 23 and V-notch-surfaced section 24 of the electron supply layer 18 are of the same thickness. Then the field strength due to the depolarization of the V-notch-surfaced section 24 of the electron supply layer 18 is expressed as $E \cos \theta$ where E is the field strength normal to the flat surfaces 15 of the electron transit layer 10 due to the depolarization of the flat-surfaced sections 23 of the electron supply layer 18, and $\theta$ is the angle of the slanting surfaces 21 and 22 of the V-notch 19 in the electron supply layer with respect to its flat surfaces 20. In short the field strength due to the V-notch-surfaced section 24 of the electron supply layer 18 is less than that due to the flat-surfaced sections 23 of the electron supply layer, and even more so because the V-notch-surfaced section 24 of the electron supply layer 18 is thinner than its flat-surfaced sections 23.

In this embodiment the field strength due to the V-notch-surfaced section 24 of the electron supply layer 18 is set less than that due to the built-in potential between the electron supply layer and the Schottkey gate electrode 28. Consequently, without a bias voltage, a two-dimensional electron gas layer does not appear in the electron transit layer 10 due to the V-notch-surfaced section 24 of the electron supply layer 18, or at most not to such a degree as to provide a current path. It is thus seen that the two-dimensional electron gas layer 25 between the source and drain electrodes 26 and 27 is normally broken at and adjacent the V-notch 11 in the electron transit layer 10. Normally, therefore, there is no current flow between these electrodes 26 and 27.

The built-in potential will be cancelled when a voltage above a predetermined threshold is applied between source electrode 26 and gate electrode 28, with the drain electrode 27 made higher in potential than the source electrode. The HEMT will turn on as a channel appears adjacent the V-notch 11 in the electron transit layer 10, causing a current flow along the path comprising the source electrode 26, electron supply layer 18, two-dimensional electron gas layer 25 and channel in the electron transit layer 10, electron supply layer 18, and drain electrode 27.

The benefits gained by this embodiment of the invention may be recapitulated as follows:

1. The V-notch 11 in the electron transit layer 10 is created by lateral epitaxial growth of the semiconductor material. The V-notch 19 in the electron supply layer 18 is formed by depositing another semiconductor material on the surfaces, including those defining the V-notch 11, of the preformed electron transit layer 10. Both V-notches 11 and 19 are made without resort to etching which almost unavoidably takes its toll in semiconductor crystallinity. The normally-off HEMT according to the invention is therefore low in turn-on resistance and favorable in frequency characteristic.

2. The epitaxial fabrication of the electron transit layer 10, partly involving lateral overgrowth, serves to restrict the propagation of dislocations. Not only this electron transit layer 10 but the overlying electron supply layer 18 too will be low in dislocation concentration, contributing toward enhancement of HEMT performance.

3. The HEMT is normally off simply as the two-dimensional electron gas layer is not created at all, or not to such a degree as to provide a channel, in the V-notch-surfaced section 14 of the electron transit layer 10. This is because the vertical field (field normal to the surface 4 of the substrate 1) due to the depolarization of the V-notch-surfaced section 24 of the electron supply layer 18 is weaker than that due to its flat-surfaced sections 23.

4. The normally-off performance of the HEMT is further ensured by making the thickness $W_2$ of the V-notch-surfaced section 24 of the electron supply layer 18 less than that $W_1$ of its flat-surfaced sections 23. This difference in thickness makes the field due to the V-notch-surfaced section 24 of the electron supply layer 18 still weaker than that due to its flat-surfaced sections 23.

5. The flat-surfaced sections 23 of the electron supply layer 18 are so thick that the two-dimensional electron gas layers 25 due to these flat-surfaced sections 23 and the still thicker flat-surfaced sections 12 and 13 of the electron transit layer 10 are reduced in resistance.

6. The angles of the surfaces 16 and 17 of the V-notch 16 in the electron transit layer 10, the angles of the surfaces 21 and 22 of the V-notch 19 in the electron supply layer 18, and the thickness of the V-notch-surfaced section 24 of the electron supply layer 18 are all adjustably variable by the width and spacings of the antigrowth masks 9 on the substrate 1 and by the rate of lateral overgrowth of the electron transit layer 10 over the antigrowth masks. The threshold of the normally-off HEMT is therefore finely adjustable.

7. The gate electrode 28 is easy to fabricate as it covers the entire surfaces of the V-notch 19 in the electron supply layer 18.

Figure 7:
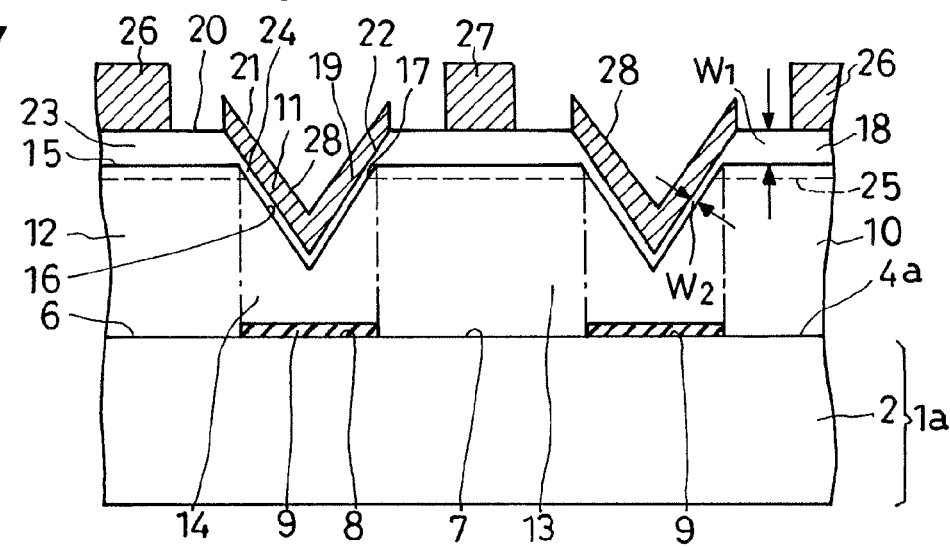
FIG. 7 is a view similar to FIG. 6 but showing another preferred form of normally-off HEMTs according to the invention.

Embodiment of FIG. 7

The HEMT shown here differs from that of FIG. 6 only in the absence of the buffer 3, FIG. 2, from its substrate $1_a$. This substrate $1_a$ is therefore a single layer 2 of silicon throughout.

The antigrowth masks 9 directly overlie the silicon substrate $1_a$. These masks 9 and the other constituents of the HEMT, identified by the same reference characters as their counterparts in FIG. 6, are made by the same methods as set forth above with reference to FIGS. 1-6. This embodiment offers the advantage, in addition to all those enumerated above, that all the semiconductor growth processes needed for the HEMT fabrication can be streamlined. An independent buffer might be interposed between substrate $1_a$ and electron transit layer 10, though.

Embodiment of FIGS. 8-10

The third preferred form of HEMTs are shown in two different stages of fabrication in FIGS. 8 and 9 and completed in FIG. 10. This embodiment features a quasi-V-notch $11_a$, FIGS. 9 and 10, in an electron transit layer 10 and a similar quasi-V-notch $19_a$, FIG. 10, in an electron supply layer $18_a$ in substitution respectively for the V-notches 11 and 19 in the first disclosed HEMTs of FIG. 6 but is otherwise identical therewith. The quasi-V-notch $11_a$ is so named because it has a flat bottom 36 in addition to a pair of oppositely slanting side surfaces $16_a$ and $17_a$. The quasi-V-notch $19_a$ in the electron supply layer $18_a$ likewise has a flat bottom 37 in addition to a pair of oppositely slanting side surfaces $21_a$ and $22_a$.

For the fabrication of the HEMTs with the quasi-V-notches $11_a$ and $19_a$, there is first prepared the substrate 1 having the antigrowth masks 9 at prescribed spacings on its top surface 4. Then a preselected semiconducting material (e.g., GaN) is deposited on the partly masked surface 4 of the substrate 1. Grown under less heat and pressure than in the case of the growth of the electron transit layer 10 explained above with reference to FIGS. 3 and 4, GaN will soon take on a transitional, intermediary form $10_a'$, FIG. 8, of the desired electron transit layer seen at $10_a$ in FIG. 9.

It will be observed from FIG. 8 that the intermediary form $10_a'$ of the electron transit layer $10_a$ is comprised of discrete, flat-surfaced sections 31 on the spacings 6 and 7 between the antigrowth masks 9 on the substrate surface 4 and a pair of lateral overgrowths jutting out onto each antigrowth mask from these flat-surfaced sections. Each pair of lateral overgrowths, shown still considerably spaced from each other, have slanting surfaces 32 and 33 and nonslanting, parallel surfaces 34 and 35.

Then the epitaxial growth of GaN is continued with the growth parameters so altered from those for the growth of the intermediary form $10_a'$ above that the lateral growth rate may be higher than the vertical. So grown, the intermediary form $10_a'$ will soon develop into the desired electron transit layer $10_a$. FIG. 9, complete with the quasi-V-notches $11_a$. The intermediary form $10_a'$ of the electron transit layer $10_a$ is also shown in phantom outline in FIG. 9 in order to facilitate understanding. The completed electron transit layer $10_a$ comprises flat-surfaced sections $12_a$ and $13_a$ on the unmasked parts 6 and 7 of the substrate surface 4 and quasi-V-notch-surfaced sections $14_a$ (another example of slant-surfaced section) on the antigrowth masks 9. The flat-surfaced sections $12_a$ and $13_a$ have flat surfaces $15_5$ whereas the quasi-V-notch-surfaced sections $14_a$ have the trenches or quasi-V-notches $11_a$.

Should the epitaxial growth be allowed to proceed past the state of FIG. 9, the entire electron transit layer $10_a$ would sooner or later become flat-surfaced. The growth must therefore be cut short at an appropriate moment, represented by FIG. 9, prior to disappearance of the quasi-V-notches $11_a$. Each quasi-V-notch $11_a$ has a pair of slanting side surfaces $16_a$ and $17_a$ and a flat bottom 36. The bottom 36 is parallel to the substrate surface 4, and the slanting side surfaces $16_a$ and $17_a$ are each at an angle θ to the bottom 36.

The next step, illustrated in FIG. 10, is the fabrication of the AlGaN electron supply layer $18_a$ on the electron transit layer $10_a$ by the same method as used for fabrication of its counterpart 18 in the first disclosed embodiment. The electron supply layer $18_a$ has a flat surface $20_a$ parallel to the substrate surface 4. The electron supply layer $18_a$ is so thin that its surface $20_a$ has formed therein trenches or quasi-V-notches $19_a$ in register with the quasi-V-notches $11_a$ in the electron transit layer $10_a$.

As has been stated, the growth parameters of the AlGaN electron supply layer $18_a$ are so predetermined that its lateral growth rate is less than the vertical. So grown, the electron supply layer $18_a$ has sections $23_a$ and $24_a$ of two unequal thicknesses $W_1$ and $W_2$, $W_1$ being greater than $W_2$. The thicker sections $23_a$ of the electron supply layer $18_a$ overlie both the flat surfaces $15_a$, FIG. 9, of the electron transit layer $10_a$ and the flat bottoms 36, FIG. 9, of the quasi-V-notches $11_a$ in the electron transit layer. The thinner sections $24_a$ of the electron supply layer $18_a$ cover the slanting side surfaces $16_a$ and $17_a$ of the quasi-V-notches $11_a$ in the electron transit layer $10_a$.

Thus, in this HEMT too, the two-dimensional electron gas layer 25 normally appears along the heterojunctions between the flat-surfaced sections $12_a$ and $13_a$ of the GaN electron transit layer $10_a$ and the thicker sections $23_a$ of the electron supply layer $18_a$. However, no two-dimensional electron gas layer at all, or no two-dimensional electron gas layer of sufficient electron concentration to provide a current path, normally appears along the heterojunctions between the electron transit layer $10_a$ and the thinner sections $24_a$ of the electron supply layer $18_a$.

Thus, despite the presence of the flat bottoms 36 and 37, the quasi-V-notches $11_a$ in the electron transit layer $10_a$ and the quasi-V-notches $19_a$ in the electron supply layer $18_a$ are just as effective as their V-notch counterparts in the foregoing embodiments to normally introduce breaks into the two-dimensional electron gas layer 25. A normally-off HEMT is here again realized.

The source electrode 26 is formed on the thicker section $23_a$ of the electron supply layer $18_a$ so as to lie opposite the flat-surfaced section $12_a$ of the electron transit layer $11_a$ via the electron supply layer. The drain electrode 27 is formed on the thicker section $23_a$ of the electron supply layer $18_a$ so as to lie opposite the flat-surfaced section $13_a$ of the electron transit layer $10_a$ via the electron supply layer. The gate electrode 28 is formed in the quasi-V-notch $19_a$ in the electron supply layer $18_a$.

Normally, as indicated by the broken lines in FIG. 10, the two-dimensional electron gas layer 25 has interruptions along the slanting side surfaces $16_a$ and $17_a$ of the quasi-V-notches $11_a$ in the electron transit layer $10_a$. These interruptions will be filled up on application of a voltage in excess of a predetermined threshold to the gate electrode 28. Namely, a channel appears along the slanting side surfaces $16_a$ and $17_a$ of the quasi-V-notches $11_a$ in the electron transit layer $10_a$. If then the drain electrode 27 is higher in potential than the source electrode 26, there will be a flow of electrons along the path comprising the source electrode 26, electron supply layer $18_a$, two-dimensional electron gas layer 25 and channel in the electron transit layer $10_a$, electron supply layer $18_a$, and drain electrode 27.

It is now apparent that this HEMT with the quasi-V-notches $11_a$ and $19_a$ obtains all the listed benefits of the first disclosed embodiment. Additionally, the quasi-V-notches $11_a$ and $19_a$ prove that the notches need not be of exactly V-shaped cross section. Some departures from this shape are tolerated as long as an interruption is normally created in the two-dimensional electron gas layer.

Figure 11:
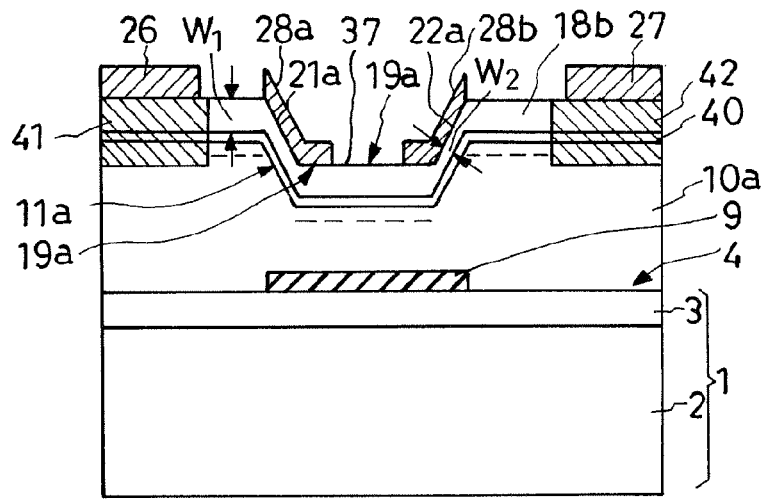
FIG. 11 is a diagrammatic sectional illustration of a further preferred form of normally-off HEMT according to the invention.

Embodiment of FIG. 11

The HEMT shown here differs from that of FIG. 10 in the following respects:

1. The gate electrode is split into two parts $28_a$ and $28_b$.
2. The electron supply layer $18_b$ is made from n-doped $Al_xGa_{1-x}N$.
3. A spacer layer 40, itself well known in the art, of undoped AlN is interposed between the n-type electron supply layer $18_b$ and the electron transit layer $10_a$ of GaN. The spacer layer 40 might be considered a sublayer of a multisublayered electron supply layer, the illustrated electron supply layer $18_b$ being then another sublayer of that multisublayered electron supply layer.
4. Two n-doped regions 41 and 42 are formed in the electron supply layer $18_b$ so as to underlie the source and drain electrodes 26 and 27, respectively, in order to aid these electrodes in low resistance contact with the electron supply layer.

Received in the quasi-V-notch $19_a$ in the electron supply layer $18_b$, the pair of gate electrode parts $28_a$ and $28_b$ are held respectively against the pair of slanting side surfaces $21_a$ and $22_a$ of the notch and spaced from each other over the flat bottom 37 of the notch. It is understood that the pair of gate electrode parts $28_a$ and $28_b$ are electrically interconnected outside the quasi-V-notch $19_a$, so that they are electrically one.

The spacer layer 40 serves to enlarge the band offset at the heterojunction between electron transit layer $10_a$ and electron supply layer $18_b$ for higher electron mobility. The n-doped regions 41 and 42 function to reduce the resistance of contact with the overlying source electrode 26 and drain electrode 27.

Being of the same construction as its FIG. 10 counterpart in all the other details of construction, this HEMT offers the same benefits therewith. The spacer layer 40 and/or n-doped regions 41 and 42 could be incorporated in all the other embodiments disclosed herein. The electron supply layer $18_b$ could be of undoped semiconductor material.

Figure 12:
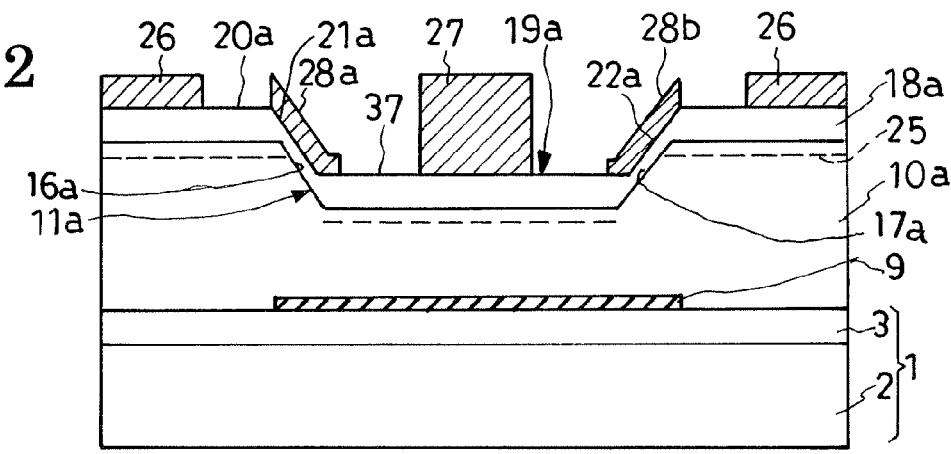
FIG. 12 is a diagrammatic sectional illustration of a further preferred form of normally-off HEMT according to the invention.

Embodiment of FIG. 12

This HEMT is similar to that of FIG. 11 in that the gate electrode is split into two parts $28_a$ and $28_b$ which are held against the slanting side surfaces $21_a$ and $22_a$ of the quasi-V-notch $19_a$ in the electron supply layer $18_a$. The drain electrode 27 is placed on the flat bottom 37 of the quasi-V-notch $19_a$, and another source electrode 26 takes the place of the drain electrode 27 in FIG. 11. All the other details of construction are as described above with reference to FIG. 10.

A most pronounced difference of this embodiment from the others presented so far is the placement of the drain electrode 27 on the flat bottom 37 of the quasi-V-notch $19_a$. There are one gate electrode $28_a$ between one source electrode 26 and the drain electrode 27, and the other gate electrode $28_b$ between this drain electrode and the other source electrode 26. The two-dimensional electron gas layer 25 is normally broken under both gate electrodes $28_a$ and $28_b$. It is therefore apparent that this embodiment possesses the same benefits as does that of FIG. 10.

Figure 13:
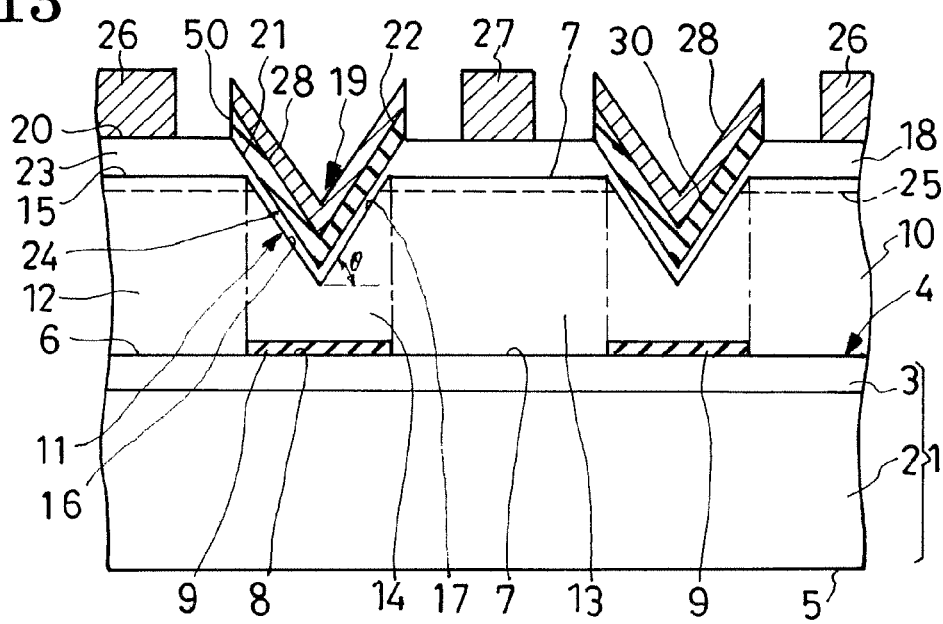
FIG. 13 is a diagrammatic sectional illustration of a further preferred form of normally-off HEMTs according to the invention.

Embodiment of FIG. 13

Here is shown a metal-insulator-semiconductor (MIS) gate HEMT based upon the embodiment of FIG. 6. The MIS-gate HEMT is so named because the gate electrodes 28 are furnished with gate insulators 50. All the other details of construction are as previously described in connection with FIG. 6. This HEMT of FIG. 13 slightly differs in construction from that widely known as such today but is the same in fundamental operational principle.

The gate insulators 50 are layers of electrically insulating material such as silicon oxide formed on the slanting surfaces 21 and 22 of the V-notches 19 in the electron supply layer 18. Seated on these gate insulators 50, the gate electrodes 28 are capacitively coupled to the electron supply layer 18.

Normally, the two-dimensional electron gas layer 25 is interrupted along the slanting surfaces of the V-notches in the electron transit layer 10, so that this MIS-gate HEMT is also normally off. Upon application of a voltage in excess of a predetermined threshold to the gate electrode 28, a channel appears along the slanting side surfaces 16 and 17 of the quasi-V-notches 11 in the electron transit layer 10, causing conduction between source electrode 26 and drain electrode 27. The MIS-gate HEMT offers the advantage of reduction in gate leak current, in addition to all those enumerated in conjunction with the first disclosed embodiment of FIG. 6. The gate insulators 50 might be incorporated in all the other embodiments disclosed herein.

Figure 14:
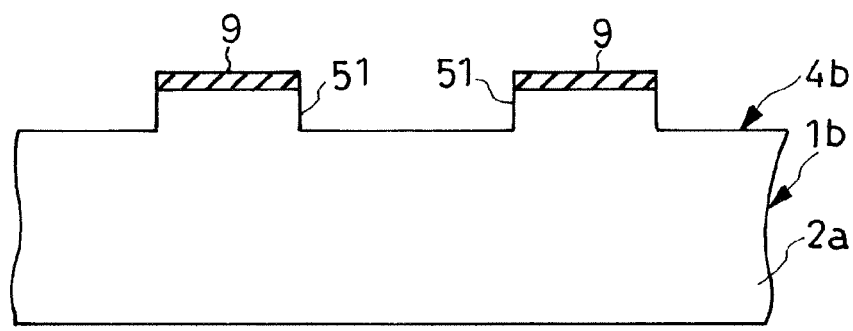
FIG. 14 is a view similar to FIG. 2 but showing an alternative form of substrate for use in fabrication of normally-off HEMTs according to the invention.

Embodiment of FIG. 14

The substrate surface on which the antigrowth masks are formed need not be flat as in all the preceding embodiments. FIG. 14 shows a modified substrate $1_b$ having a top or first major surface $4_b$ with flat ridges 51 formed thereon at constant spacings. The antigrowth masks 9 are formed on these ridges 51 of the substrate surface $4_b$. The substrate $1_b$ itself is of a single semiconductor layer $2_a$, as is the substrate $1_a$ of the FIG. 7 embodiment.

A first semiconducting material such as GaN and then second semiconducting material such as AlGaN are grown in succession on the ridged and masked surface $4_b$ of the substrate $1_b$. Through control of the growth parameters of these semiconducting materials as proposed by the instant invention, there can be obtained on the substrate surface $4_b$ a lamination of the electron transit layer 10 and electron supply layer 18 as in FIG. 6, or of the electron transit layer $10_a$ and electron supply layer $18_a$ as in FIG. 10.

Figure 15:
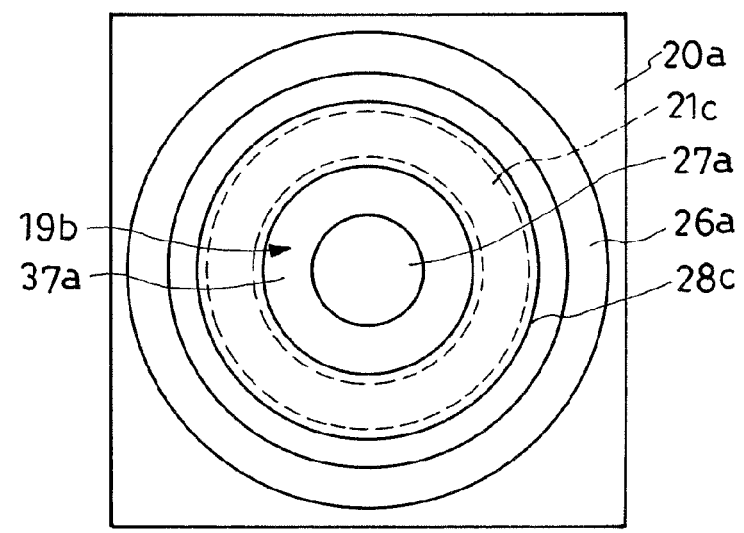
FIG. 15 is a diagrammatic plan view of a further preferred form of normally-off HEMT according to the invention.

Embodiment of FIG. 15

The principles of this invention are applicable to a HEMT with a concentric electrode arrangement in order to make the same normally off. FIG. 15 depicts such a concentrically electroded HEMT embodying the principles of the invention. Instead of the V-notches or quasi-V-notches of rectilinear shape in the foregoing embodiments, this concentrically electroded HEMT adopts indentations of circular shape as seen from above as in this figure. The indentation, not seen here, in the electron transit layer and the indentation $19_b$ in the electron supply layer are both in the shape of an inverted truncate cone. Thus, for example, the indentation $19_b$ in the electron supply layer has a flat circular bottom $37_a$ and a slanting annular side $21_c$. Being quasi-V-shaped in a diametral section, the indentation $19_b$ may be considered a type of quasi-V-notch and will be hereinafter referred to as such.

The drain electrode $27_a$ is disposed centrally on the flat bottom $37_a$ of the quasi-V-notch $19_b$. The source electrode $26_a$, annular in shape, is formed on the surface $20_a$ of the electron supply layer and concentrically surrounds the quasi-V-notch $19_b$ with a spacing therefrom. The gate electrode $28_c$, also annular in shape, is formed on the slanting side $21_c$ of the quasi-V-notch $19_b$.

For fabricating the main semiconductor region of the HEMT complete with the circular quasi-V-notch $19_b$, there may first be prepared a substrate similar to that shown at 1 in FIG. 12. An antigrowth mask of circular shape may be formed on the surface of this substrate. Then the required two semiconducting materials may be grown one after the other on the masked surface of the substrate with the growth parameters controlled as aforesaid.

Being cross sectionally identical in configuration with the HEMT of FIG. 12, this circular HEMT provides the same benefits as do the other embodiments of the invention disclosed herein. It will also be apparent that the electrodes $26_a$, $27_a$ and $28_c$ and quasi-V-notch $19_b$ of circular or annular shape shown here are variously modifiable in shape, for example into square or otherwise polygonal, or elliptic shape.

Figure 16:
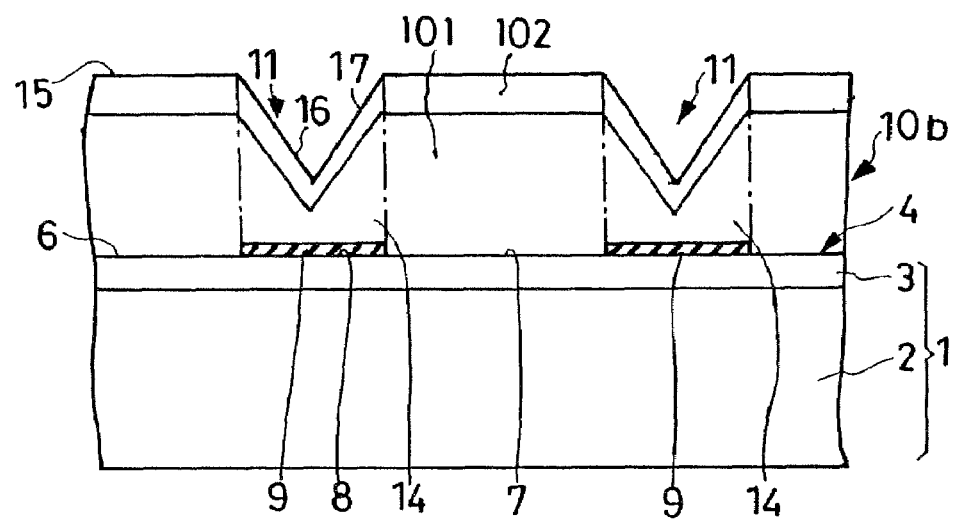
FIG. 16 is a view similar to FIG. 4 except that the first semiconductor layer is comprised of two sublayers created by different epitaxial growth methods by way of a further preferred form of normally-off HEMTs according to the invention.

Embodiment of FIG. 16

The electron transit layer, much thicker than the overlying electron supply layer, of the normally-off HEMT according to the invention may be grown by two different methods, one providing for a higher growth rate and the other for a less dislocation concentration. The electron transit layer seen at $10_b$ in FIG. 16 is wholly made from GaN but has a first part 101 grown by known hydride vapor phase epitaxy (HVPE) and a second part 102 by MOVPE. HVPE is higher in growth rate than MOVPE, but the latter is less in dislocation concentration than the former. In FIG. 16, therefore, the electron transit layer $10_b$ is mostly fabricated efficiently, but the unshown electron supply layer can be formed on the better-crystallinity part 102 of the electron transit layer.

Figure 17:
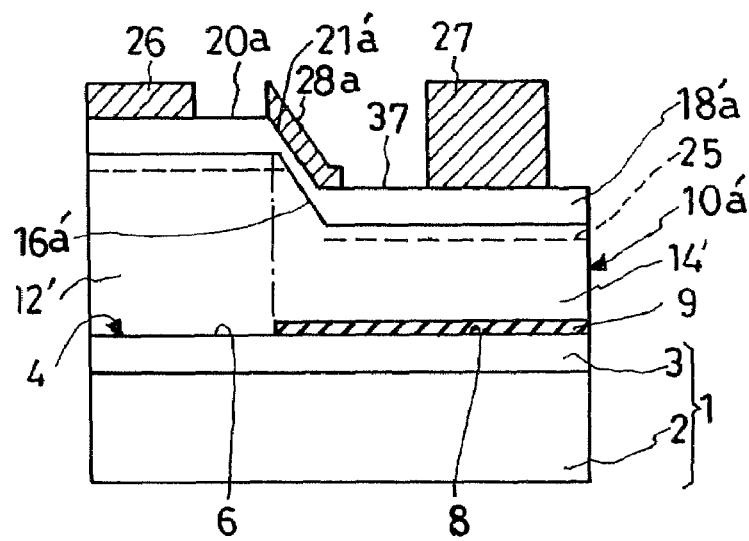
FIG. 17 is a diagrammatic sectional illustration of a still further preferred form of normally-off HEMT according to the invention.

Embodiment of FIG. 17

The right-hand side of the drain electrode 27 in the HEMT of FIG. 12 is missing from that presented in FIG. 17. An additional example of quasi-V-notch normally-off HEMT according to the invention, this embodiment is analogous with that of FIG. 12 in all the other details of construction.

For fabrication of this HEMT, part 8 of the first major surface 4 of the substrate 1 is first antigrowth-masked at 9, leaving the other surface part 6 unmasked. Then the electron transit layer $10_a'$ is formed on the masked substrate surface 4 by epitaxial growth of a first semiconducting material. The thus-formed electron transit layer $10_a'$ has a flat-surfaced section 12' overlying the unmasked part 6 of the substrate surface 4 and a quasi-V-notch-surfaced section 14' overlying the antigrowth mask 9. Formed by lateral overgrowth onto the antigrowth mask 9, the quasi-V-notch-surfaced section 14' of the electron transit layer $10_a'$ comprises a flat-surfaced subsection which is less in thickness than the flat-surfaced section 12', and a slant-surfaced subsection having a slanting surface $16_a'$ between the flat surfaces of the flat-surfaced section 12' and the flat-surfaced subsection of the quasi-V-notch-surfaced section 14'.

Then the electron supply layer $18_a'$ of a second semiconducting material is grown by epitaxy on the electron transit layer $10_a'$. The electron supply layer $18_a'$ has the quasi-V-notch defined by the flat bottom 37 and a slanting surface $21_a'$, the latter being in register with the slanting surface $16_a'$ of the electron transit layer $10_a'$.

The next step is electroding. On the flat surface $20_a$ of the electron supply layer $18_a'$ there is formed the source electrode 26 which is electrically coupled to the two-dimensional electron gas layer 25 due to the heterojunction between the flat-surfaced section 12' of the electron transit layer $10_a'$ and the flat-surfaced section of the electron supply layer $18_a'$. The drain electrode 27 is formed on the flat bottom 37 of the quasi-V-notch defined by the electron supply layer $18_a'$ and electrically coupled to the two-dimensional electron gas layer 25 due to the heterojunction between the flat-surfaced subsection of the quasi-V-notch-surfaced section 14' of the electron transit layer $10_a'$ and the flat-bottom-surfaced section of the electron supply layer $18_a'$. The gate electrode $28_a$ is formed on the slanting surface $21_a'$ of the quasi-V-notch in the electron supply layer $18_a'$.

This embodiment is similar to that of FIG. 12 in fundamental construction and so has the same benefits as that of FIG. 10.

Possible Modifications

Notwithstanding the foregoing detailed disclosure it is not desired that the present invention be limited by the exact showings of the drawings or the description thereof. The following is a brief list of possible modifications, alterations or adaptations of the illustrated representative semiconductor devices which are all believed to fall within the purview of the claims annexed hereto:

1. The electron transit layer 10, $10_a$ or $10_a'$, electron supply layer 18, $18_a$ or $18_a'$, and spacer layer 40 of the illustrated normally-off field-effect semiconductor devices according to the invention could be made from compound semiconductors other than GaN and AlGaN, including III-V compound semiconductors such as InGaN, AlInGaN, AlN, InAlN, AlP, GaP, AlInP, GaInP, AlGaP, AlGaAs, GaAs, AlAs, InAs, InP, InN, and GaAsP.

2. The first layer 2 of the substrate 1 and the monolayered substrate $1_a$ could be made from materials other than silicon, examples including both semiconductors such as silicon carbide, gallium nitride and aluminum nitride, and insulators such as sapphire, and ceramics.

3. A back electrode could be provided on the underside of the substrate 1 or $1_a$.

4. The electron supply layer of the various embodiments disclosed above might be replaced by a hole supply layer of a p-type semiconductor, in which case a two-dimensional hole gas layer would be generated in place of the two-dimensional electron gas layer 25. The two-dimensional hole gas layer would be normally broken according to the invention just as the two-dimensional electron gas layer is.

5. The electron supply layer 18, $18_a$, $18_a'$ and $18_b$ could all be of the same thickness throughout, provided that the two-dimensional electron gas layer is normally interrupted solely by virtue of the slanting surfaces 16 and 17 of the V-notch 11, the slanting side surfaces $16_a$ and $17_a$ of the quasi-V-notch $11_a$, the slanting surfaces 21 and 22 of the V-notch 19, the slanting side surfaces $21_a$ and $22_a$ of the quasi-V-notch $19_a$, or the slanting surface $21_a'$ of the quasi-V-notch in the embodiment of FIG. 17.

6. The electron supply layer 18, $18_a$, $18_b$ or $18_a'$ could be removed from under the source electrode 26 and drain electrode 27 in the disclosed embodiments, and these electrodes placed in direct contact with the electron transit layer 10 or 10$_a$.

7. The monolayered substrate 1$_a$ of the embodiment of FIG. 7 could be employed in the other embodiments of FIGS. 8-13, 15 and 16.

8. Contact layers could be provided under the source electrode 26 and drain electrode 27.

9. A cap layer of undoped GaN, AlGaN or like materials for surface charge control and other purposes could be provided on the electron supply layer 18, 18$_a$, 18$_b$ or 18$_a$'.

10. The locations of the source electrode 26 and drain electrode 27 are interchangeable in the embodiments disclosed.

11. In use of the buffered substrate 1 the antigrowth mask or masks could be formed on the buffer layer 3 via a layer, deposited as by MOVPE, of the same material (e.g., undoped GaN) as that of the electron transit layer.

What is claimed is:

1. A method of fabricating a normally-off field-effect semiconductor device utilizing a two-dimensional carrier gas layer created by a heterojunction between layers of dissimilar semiconducting materials as a channel, comprising the steps of:
   (a) covering part of a major surface of a substrate with an antigrowth mask;
   (b) epitaxially growing a first semiconducting material on the masked major surface of the substrate until there is created a first semiconductor layer which comprises a first and a second flat-surfaced section and a slant-surfaced section therebetween, at least the slant-surfaced section of the first semiconductor layer being formed on the antigrowth mask by lateral overgrowth of the first semiconducting material;
   (c) epitaxially growing a second semiconducting material on the first semiconductor layer thereby creating a second semiconductor layer having a first and a second flat-surfaced section and a slant-surfaced section which are formed respectively on the first and the second flat-surfaced section and the slant-surfaced section of the first semiconductor layer;
   (d) creating a first major electrode which is electrically coupled to a two-dimensional carrier gas layer due to a heterojunction between the first flat-surfaced sections of the first and the second semiconductor layer;
   (e) creating a second major electrode which is electrically coupled to the two-dimensional carrier gas layer due to a heterojunction between the second flat-surfaced sections of the first and the second semiconductor layer; and
   (f) creating gating means on the slant-surfaced section of the second semiconductor layer for control of conduction between the first and the second major electrode.

2. A method of fabricating a normally-off field-effect semiconductor device as defined in claim 1, wherein the first and the second flat-surfaced section of the second semiconductor layer are sufficiently thick to normally generate two-dimensional carrier gas layers due to heterojunctions thereof with the first and the second flat-surfaced section of the first semiconductor layer, and wherein the slant-surfaced section of the second semiconductor layer is too thin to normally generate a two-dimensional carrier gas layer due to a heterojunction thereof with the slant-surfaced section of the first semiconductor layer.

3. A method of fabricating a normally-off field-effect semiconductor device as defined in claim 1, wherein the first semiconducting material is grown on the masked major surface of the substrate until there is created the first semiconductor layer having a notch of V-shaped cross section formed in the slant-surfaced section thereof.

4. A method of fabricating a normally-off field-effect semiconductor device as defined in claim 3, wherein the slant-surfaced section of the second semiconductor layer is formed in the notch in the first semiconductor layer and is thinner than the first and the second flat-surfaced section of the second semiconductor layer.

5. A method of fabricating a normally-off field-effect semiconductor device as defined in claim 1, wherein the first semiconducting material is grown on the masked major surface of the substrate in such a manner that the first semiconductor layer has a notch of quasi-V-shaped cross section formed in the slant-surfaced section, the notch of quasi-V-shaped cross section being defined by a pair of slanting side surfaces and a flat bottom therebetween.

6. A method of fabricating a normally-off field-effect semiconductor device as defined in claim 5, wherein the slant-surfaced section of the second semiconductor layer is formed in the notch of quasi-V-shaped cross section in the first semiconductor layer and itself defines a quasi-V-shaped notch similar to that in the first semiconductor layer, the second semiconductor layer being thinner at its parts defining the pair of slanting side surfaces of the notch than at its part defining the flat bottom of the notch.

7. A method of fabricating a normally-off field-effect semiconductor device as defined in claim 5, wherein the first semiconductor layer having the quasi-V-shaped notch is formed by:
   (a) epitaxially growing the first semiconducting material on the masked major surface of the substrate under a first set of growth parameters such that there is created an intermediary form of the first semiconductor layer which comprises two flat-surfaced sections on opposite sides of the antigrowth mask, the flat-surfaced sections of the intermediary form of the first semiconductor layer having a pair of lateral overgrowths jutting out therefrom onto the antigrowth mask;
   (b) continuing the epitaxial growth of the first semiconducting material under a second set of growth parameters such that the growth rate of the first semiconducting material is higher in a direction parallel to the masked major surface of the substrate than in a direction normal thereto.

8. A method of fabricating a normally-off field-effect semiconductor device utilizing a two-dimensional carrier gas layer created by a heterojunction between layers of dissimilar semiconducting materials as a channel, comprising the steps of:
   (a) covering part of a major surface of a substrate with an antigrowth mask;
   (b) epitaxially growing a first semiconducting material on the masked major surface of the substrate both in a direction normal, and in a direction parallel, to the masked major surface of the substrate until there is created a first semiconductor layer which comprises a first and a second flat-surfaced section and, therebetween, a quasi-V-notch-surfaced section on the antigrowth mask, the quasi-V-notch-surfaced section of the first semiconductor layer having a notch of quasi-V-shaped cross section defined therein by a pair of slanting side surfaces and a flat bottom therebetween;
   (c) epitaxially growing a second semiconducting material on the first semiconductor layer thereby creating a second semiconductor layer having a first and a second flat-surfaced section and a quasi-V-notch-surfaced section therebetween, the first and the second flat-surfaced section of the second semiconductor layer being formed respectively on the first and the second flat-surfaced section of the first semiconductor layer, the quasi-V-notch-surfaced section of the second semiconductor layer being formed on the quasi-V-notch-surfaced section of the first semiconductor layer and having a notch of quasi-V-shaped cross section defined therein by a pair of slanting side surfaces and a flat bottom therebetween;
(d) creating a first major electrode which is electrically coupled to a two-dimensional carrier gas layer due to the heterojunction between the first flat-surfaced sections of the first and the second semiconductor layer;
(e) creating a second major electrode which is electrically coupled to a two-dimensional carrier gas layer due to the heterojunction between the flat bottoms of the quasi-V-shaped notches in the quasi-V-notch-surfaced sections of the first and the second semiconductor layer; and
(f) creating gating means on one slanting side surface of the quasi-V-shaped notch in the second semiconductor layer for control of conduction between the first and the second major electrode.

9. A method of fabricating a normally-off field-effect semiconductor device as defined in claim 8, wherein the second semiconductor layer is thinner at its parts defining the pair of slanting side surfaces of the notch than at its part defining the flat bottom of the notch.

10. A method of fabricating a normally-off field-effect semiconductor device utilizing a two-dimensional carrier gas layer created by a heterojunction between layers of dissimilar semiconducting materials as a channel, comprising the steps of:
(a) covering part of a major surface of a substrate with an antigrowth mask;
(b) epitaxially growing a first semiconducting material on the masked major surface of the substrate both in a direction normal, and in a direction parallel, to the masked major surface of the substrate until there is created a first semiconductor layer which comprises a first and a second flat-surfaced section and a slant-surfaced section therebetween, the first flat-surfaced section of the first semiconductor layer being formed on unmasked part of the major surface of the substrate, the second flat-surfaced section of the first semiconductor layer being formed on the antigrowth mask on the major surface of the substrate and being thinner than the first flat-surfaced section, the slant-surfaced section of the first semiconductor layer being disposed between the first and the second flat-surfaced section of the first semiconductor layer;
(c) epitaxially growing a second semiconducting material on the first semiconductor layer thereby creating a second semiconductor layer having a first and a second flat-surfaced section and a slant-surfaced section therebetween, the first and the second flat-surfaced section of the second semiconductor layer being formed respectively on the first and the second flat-surfaced section of the first semiconductor layer, the slant-surfaced section of the second semiconductor layer being formed on the slant-surfaced section of the first semiconductor layer;
(d) creating a first major electrode which is electrically coupled to a two-dimensional carrier gas layer due to the heterojunction between the first flat-surfaced sections of the first and the second semiconductor layer;
(e) creating a second major electrode which is electrically coupled to a two-dimensional carrier gas layer due to the heterojunction between the second flat-surfaced sections of the first and the second semiconductor layer; and
(f) creating gating means on the slant-surfaced section of the second semiconductor layer for control of conduction between the first and the second major electrode.

11. A method of fabricating a normally-off field-effect semiconductor device as defined in claim 10, wherein the slant-surfaced section of the second semiconductor layer is thinner than the first and the second flat-surfaced section thereof.

12. A method of fabricating a normally-off field-effect semiconductor device utilizing a two-dimensional carrier gas layer created by a heterojunction between two dissimilar semiconducting materials as a channel, comprising the steps of:
(a) covering part of a major surface of a substrate with an antigrowth mask, the antigrowth mask on the major surface of the substrate being encircled by unmasked part of the major surface of the substrate;
(b) epitaxially growing a first semiconducting material on the masked major surface of the substrate both in a direction normal, and in a direction parallel, to the masked major surface of the substrate until there is created a first semiconductor layer which comprises a flat-surfaced section on the unmasked part of the major surface of the substrate and, surrounded by the flat-surfaced section, a quasi-V-notch-surfaced section on the antigrowth mask, the quasi-V-notch-surfaced section of the first semiconductor layer having a notch of quasi-V-shaped cross section defined therein by a substantially annular side surface and a flat bottom;
(c) epitaxially growing a second semiconducting material on the first semiconductor layer thereby creating a second semiconductor layer having a flat-surfaced section and a quasi-V-notch-surfaced section which are formed respectively on the flat-surfaced section and quasi-V-notch-surfaced section of the first semiconductor layer, the quasi-V-notch-surfaced section of the second semiconductor layer having a notch of quasi-V-shaped cross section defined therein by a substantially annular side surface and a flat bottom;
(d) creating a first major electrode which is electrically coupled to a two-dimensional carrier gas layer due to the heterojunction between the flat-surfaced sections of the first and the second semiconductor layer;
(e) creating a second major electrode which is electrically coupled to a two-dimensional carrier gas layer due to the heterojunction between the flat bottoms of the quasi-V-shaped notches in the quasi-V-notch-surfaced sections of the first and the second semiconductor layer; and
(f) creating gating means on the side surface of the quasi-V-shaped notch in the second semiconductor layer for control of conduction between the first and the second major electrode.

13. A method of fabricating a normally-off field-effect semiconductor device as defined in claim 12, wherein the quasi-V-notch-surfaced section of the second semiconductor device is thinner at its part defining the annular side of the notch than at its part defining the flat bottom of the notch.

* * * * *